US012748698B2

(12) United States Patent
King

(10) Patent No.: US 12,748,698 B2
(45) Date of Patent: Sep. 29, 2026

(54) IMPLEMENTING FUNCTIONS IN HARDWARE

(71) Applicant: Imagination Technologies Limited, Kings Langley (GB)

(72) Inventor: Rostam King, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 1132 days.

(21) Appl. No.: 17/848,569

(22) Filed: Jun. 24, 2022

(65) Prior Publication Data

US 2023/0028953 A1 Jan. 26, 2023

(30) Foreign Application Priority Data

Jun. 25, 2021 (GB) ..................................... 2109206

(51) Int. Cl.

*G06F 12/0802* (2016.01)
*G06F 30/33* (2020.01)

(52) U.S. Cl.

CPC .......... *G06F 12/0802* (2013.01); *G06F 30/33* (2020.01); *G06F 2212/60* (2013.01)

(58) Field of Classification Search

USPC .......................................................... 716/100

See application file for complete search history.

(56) References Cited

U.S. PATENT DOCUMENTS

| | | | | |
|---|---|---|---|---|
| 6,812,737 | B2 * | 11/2004 | Sueyoshi | H03K 19/17728 326/38 |
| 2006/0013506 | A1 * | 1/2006 | Song | H04N 19/44 375/E7.093 |
| 2015/0066466 | A1 * | 3/2015 | Chernyak | A61F 9/00806 703/11 |
| 2015/0134316 | A1 * | 5/2015 | Dai | A61F 9/00804 703/11 |
| 2017/0076431 | A1 * | 3/2017 | Dai | G06T 5/92 |
| 2023/0028953 | A1 * | 1/2023 | King | G06F 12/0802 |

FOREIGN PATENT DOCUMENTS

| | | | | |
|---|---|---|---|---|
| EP | 4109320 A1 * | 12/2022 | | G06F 12/0802 |
| WO | WO-2022268748 A1 * | 12/2022 | | H04N 1/6019 |

OTHER PUBLICATIONS

Hsiao et al, "Optimisation of Lookup Table Size in Table-Sound Design of Function Computation", Proceedings of the IEEE International Symposium on Circuits and Systems, 2018, pp. 1-4.

Hsiao et al., "Hierarchical Multipartite Function Evaluation," IEEE Transactions on Computers, vol. 66, 2017, pp. 89-99.

(Continued)

*Primary Examiner* — Mohammed Alam

(74) *Attorney, Agent, or Firm* — Potomac Law Group, PLLC; Vincent M DeLuca

(57) ABSTRACT

Methods for implementing or synthesizing functions in hardware and fixed-function hardware include generating a look-up table, LUT, representing the function and then applying a transform to the LUT to transform the LUT into a plurality of derived LUTs. The transform may be applied recursively. A hardware design implementing each of the derived LUTs in fixed-function hardware logic, along with a logic unit that performs the inverse transform, is then created.

20 Claims, 10 Drawing Sheets

(56) References Cited

OTHER PUBLICATIONS

Gener et al., "Lossless Look-Up Table Compression for Hardware Implementation of Transcendental Functions," IFIP/IEEE 27th International Conference on Very Large Scale Integration (VLSI-SOC), 2019, pp. 52-57.

De Dinechin et al., "Multipartite Table Methods," IEEE Transactions on Computers, vol. 54, No. 3, Mar. 2005, pp. 319-330.

* cited by examiner

IMPLEMENTING FUNCTIONS IN HARDWARE

BACKGROUND

When designing processors (e.g. CPUs, GPUs, or other processing units), there are many competing constraints including throughput, latency, and size. Many processors include fixed-function hardware logic which implements commonly used functions, such as reciprocals, logarithms and other transcendental functions; however, depending upon the complexity of the function and the nature of the hardware implementation, the area of hardware that is required to implement a function can become very large, particularly when numerous instances of a given function are required to satisfy target performance metrics.

The embodiments described below are provided by way of example only and are not limiting of implementations which solve any or all of the disadvantages of known methods of implementing functions in fixed-function hardware logic.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A method of implementing or synthesising a function in fixed-function hardware is described. The method comprises generating a look-up table, LUT, representing the function and then applying a transform to the LUT to transform the LUT into a plurality of derived LUTs. The transform may be applied recursively. A hardware design implementing each of the derived LUTs in fixed-function hardware logic, along with a logic unit that performs the inverse transform, is then created.

A first aspect provides a method of implementing a function in fixed-function hardware, the method comprising: generating a look-up table, LUT, representing the function; applying a transform to the LUT to transform the LUT into a plurality of derived LUTs; and generating a hardware design implementing each of the derived LUTs in fixed-function hardware logic and further implementing an inverse transform to generate an output value by selectively combining one or more values output from the fixed-function hardware logic dependent on the input value.

In any of the methods described herein, the method may further comprise: after performing one or more recursions, evaluating hardware metrics for the plurality of derived LUTs; and selectively performing a further recursion dependent upon the evaluation.

In any of the methods described herein, the plurality of derived LUTs may comprise at least three LUTs and the method may further comprise: combining two or more of the derived LUTs to form a new derived LUT.

In any of the methods described herein, generating a look-up table, LUT, representing the function may comprise: approximating the function with a different, prediction function; and generating a LUT representing the prediction function.

In some implementations, the LUT representing the function may comprise a LUT that approximates the function.

In some implementations, generating a look-up table, LUT, representing the function may comprise: generating a LUT based on pre-defined characteristics of the function.

In any of the methods described herein, the transform may comprise a Haar transform.

A second aspect provides a hardware logic arrangement configured to implement a function in fixed-function hardware, the hardware logic comprising: an input for receiving an input value for input to the function; a plurality of hardware logic blocks, each hardware logic block implementing one of a plurality of look-up tables, LUTs, in fixed-function hardware and at least two of the plurality of LUTs being derived from a LUT representing the function by applying a transform; and a logic unit arranged to perform an inverse transform to generate an output value by selectively combining one or more values output from the plurality of hardware logic blocks dependent on the input value.

In any of the hardware logic arrangements described herein, at least two of the plurality of LUTs derived from a LUT representing the function may be derived from a LUT that represents a prediction function that approximates the function.

Where at least two of the plurality of LUTs derived from a LUT representing the function are derived from a LUT that represents a prediction function that approximates the function, the logic unit may further comprise: a first logic unit arranged to selectively combine one or more values output from the plurality of hardware logic blocks dependent on the input value; a second logic unit arranged to selectively combine one or more different values output from the plurality of hardware logic blocks dependent on the input value; and a third logic unit arranged to perform an inverse transform based on values output from the first and second logic units and the input value.

A third aspect provides a method of synthesising a function in fixed-function hardware, the method comprising: generating a look-up table, LUT, representing the function; applying a transform to the LUT to transform the LUT into a plurality of derived LUTs; and outputting a hardware design implementing each of the derived LUTs in fixed-function hardware logic.

The fixed-function hardware logic may be embodied in hardware on an integrated circuit. There may be provided a method of manufacturing, at an integrated circuit manufacturing system, fixed-function hardware logic. There may be provided an integrated circuit definition dataset that, when processed in an integrated circuit manufacturing system, configures the system to manufacture fixed-function hardware logic. There may be provided a non-transitory computer readable storage medium having stored thereon a computer readable description of an integrated circuit that, when processed, causes a layout processing system to generate a circuit layout description used in an integrated circuit manufacturing system to manufacture fixed-function hardware logic.

There may be provided an integrated circuit manufacturing system comprising: a non-transitory computer readable storage medium having stored thereon a computer readable integrated circuit description that describes the fixed-function hardware logic; a layout processing system configured to process the integrated circuit description so as to generate a circuit layout description of an integrated circuit embodying the fixed-function hardware logic; and an integrated circuit generation system configured to manufacture the fixed-function hardware logic according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
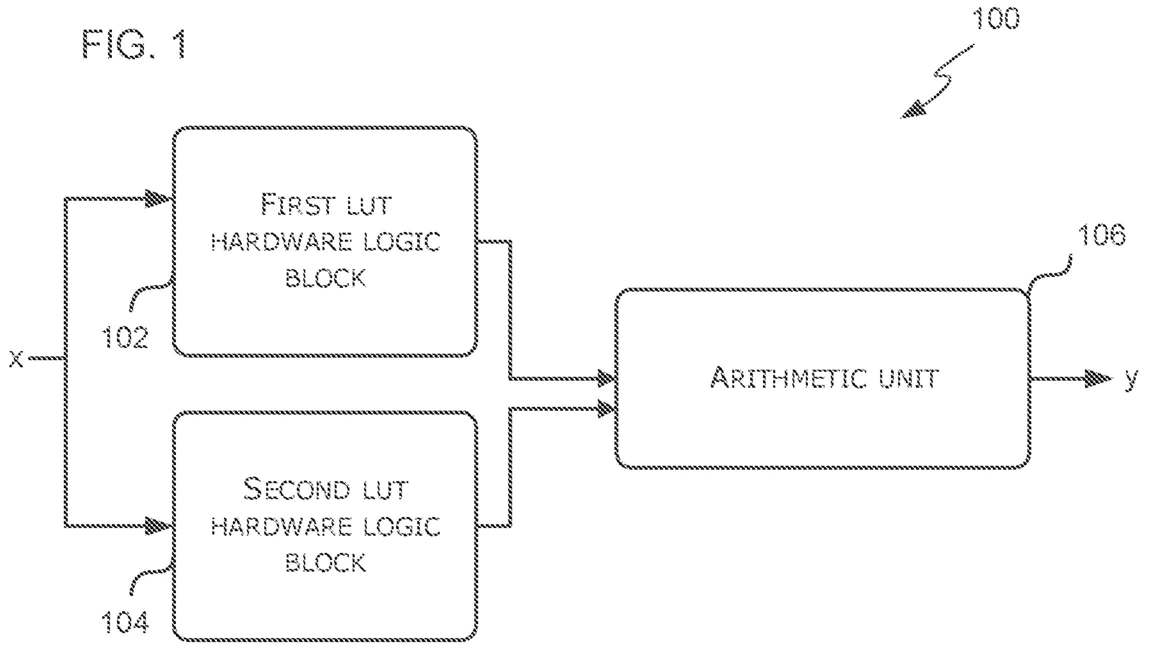
FIG. 1 is a schematic diagram showing improved fixed-function hardware that implements a function.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As described above, many processors (e.g. CPUs, GPUs, etc.) include fixed-function hardware logic which implements commonly used functions, such as reciprocals, logarithms and other transcendental functions. One way to implement a function in fixed-function hardware logic is to directly hard-code the function (or some approximation thereof) as a look-up table (LUT) in hardware. Such an implementation is simple, has low latency and the accuracy is pre-defined (i.e. is hard coded into the LUT), which may result in significantly reduced design effort, especially in the case of more exotic functions. Also, by using a LUT, since entries are specified directly, other attributes of a function may be guaranteed, e.g. such that the function is monotonic, has optimal error (for a given output precision) or possesses some pattern of values that lend themselves to efficient logical representation. However, as the size of the look-up table increases (e.g. as the number of entries and/or the number of bits in each entry increases), then the resulting hardware implementation can quickly grow to a size which is infeasible, i.e. it is too large given the size constraints of processors, especially where these processors are for use in devices which are space-constrained (e.g. wearables, mobile and/or portable devices such as smart phones, tablet computing devices, laptops, gaming devices, etc.). For example, whilst it may be possible to implement a LUT in hardware logic for a function to 8-bit precision, if the precision that is required increases to 10-bits, then the resulting hardware logic will be significantly larger. If the precision increases further (e.g. to 14 or 16-bits), then the resulting hardware logic may be infeasibly large and/or the synthesis tool may simply fail because a limit in the complexity/size of the resultant hardware has been reached.

Described herein is improved fixed-function hardware that implements a function (e.g. a mathematical function). Also described herein are improved methods of implementing a function in fixed-function hardware logic. The methods described herein may also be used as part of a synthesis tool to provide an improved method of synthesizing a function and hence the methods described herein provide an improved method of generating a hardware layout for a function. As described in more detail below, the fixed-function hardware that implements the function (which may be referred to as the 'target function') comprises fixed-function hardware logic that implements at least two (and more generally a plurality of) LUTs and one or more arithmetic logic blocks that combine outputs from the two (or more) LUTs. These two or more LUTs are derived from the single, raw LUT that represents the target function and are generated by recursively applying a transform (e.g. a wavelet transform) to the raw LUT. By transforming a single LUT that implements (or approximates) the target function into a plurality of LUTs in this way and then implementing each of the plurality of LUTs in fixed-function hardware, the overall area of hardware required to implement the target function (in fixed-function hardware) can be significantly reduced.

By increasing the number of LUTs used from a single LUT to more than one LUT, the latency does increase; however, given the speed of LUTs when implemented in fixed-function hardware, the increase in latency is small and likely to still be well within any latency limits. Furthermore, depending upon the target function and the transforms used to generate the plurality of LUTs, there may be no sequential dependency between some or all of the LUTs and as a result some or all of the LUTs may be implemented substantially or often entirely in parallel, thereby reducing the increase in latency as a result of using more than one LUT.

One or more pre- and/or post-processing optimisations may also be applied to further reduce the overall size of the hardware and/or increase the range of functions to which the methods described herein can be applied. In an example of a pre-processing operation, the target function may be represented by a prediction function. The raw LUT for the prediction function is then input to the methods described herein and transformed into a plurality of LUTs that can be more efficiently implemented in fixed-function hardware logic.

FIG. 1 is a schematic diagram showing improved fixed-function hardware 100 that implements a function using the techniques described herein. As shown in FIG. 1, instead of the hardware comprising fixed-function logic that implements a single, raw LUT that represents the function, the hardware comprises at least two blocks 102, 104 that each implement a different LUT in fixed-function logic. These multiple LUTs are derived from the raw LUT that represents the function (either the exact function or an approximation of the function) using at least one transform, as described below. To generate the output result, the inverse transform is performed by combining values output by the multiple LUT blocks 102, 104 in an arithmetic unit 106. In some examples, the arithmetic unit 106 may be an addition unit 106 as it may perform an addition operation, however, depending upon the transform used and the particular implementation, the hardware implementation may also comprise one or more multiplexing operations or more complex polynomial calculations and this is also described in more detail below.

A first method of generating fixed-function hardware that implements a function can be described with reference to the flow diagram shown in FIG. 2. The output of this method (e.g. the various LUTs and the inverse transform expression, which may be provided in the form of an RTL representation) may be fed into a logic synthesis tool or the method may be implemented within a logic synthesis tool. The method comprises generating a single, raw LUT, that is, a Boolean function that takes as input a plurality of M bits and returns as outputs a plurality of N bits, where for each input bit vector, an output bit vector is explicitly described (e.g. as in the form of a list or case statement), for the target function (block 202), to which the LUT may either correspond directly or be an approximation thereof, and then recursively applying a transform to the raw LUT to generate at least two LUTs (block 204 and optionally block 206) which together represent the target function.

The single, raw LUT for the target function that is generated (in block 202) is generated at the required precision for the output of the fixed-function hardware (i.e. the required precision for the result when calculating the function).

The transform that is applied (in block 204) may be a wavelet transform, such as the Haar wavelet or a linear wavelet, or other type of transform (e.g. involving integration or extrapolation, as described below), and the transform may then be applied recursively (e.g. one or more recursive steps in block 206). The generation of two LUTs (in block 204) involves applying the transform to the raw LUT (denoted L0) and generates two separate LUTs: a base LUT (denoted L1) and a first LUT comprising transform coefficients (denoted D0). As demonstrated by the examples described below, the nature of the coefficients in the coefficient LUT, D0, will depend upon the particular transform that is applied. Where one or more recursive steps are then applied (in block 206), the transform is applied to the base LUT generated in the immediately previous step (i.e. the first recursive step in block 206 is implemented on the base LUT generated in block 204, the second recursive step in block 206 is implemented on the base LUT generated in the first recursive step in block 206, etc.).

Where the Haar wavelet is used (in block 206), the base LUT (L1) comprises alternate entries from the raw LUT (e.g. only the even entries from the raw LUT, where the first entry is denoted entry 0 and hence is considered even) and the first coefficient LUT (D0) comprises entries where each entry comprises a value which is the difference between an odd entry from the raw LUT and a preceding even entry from the raw LUT, as shown in the example below:

| Base LUT, L1 |
|---|
| A |
| C |
| E |
| G |

| Raw LUT, L0 |
|---|
| A |
| B |
| C |
| D |
| E |
| F |
| G |
| H |

| Coefficient LUT, D0 |
|---|
| B − A |
| D − C |
| F − E |
| H − G |

It can be seen that where the Haar wavelet is used the two LUTs that are generated (in block 204) each comprise half the number of entries as the original raw LUT, although as described below, in some implementations, after the final recursion, the derived LUTs may be expanded so that they comprise the same number of entries as the raw LUT:

| Base LUT, L1 (expanded) |
|---|
| A |
| A |
| C |
| C |
| E |
| E |
| G |
| G |

| Raw LUT, L0 |
|---|
| A |
| B |
| C |
| D |
| E |
| F |
| G |
| H |

Figure 2:
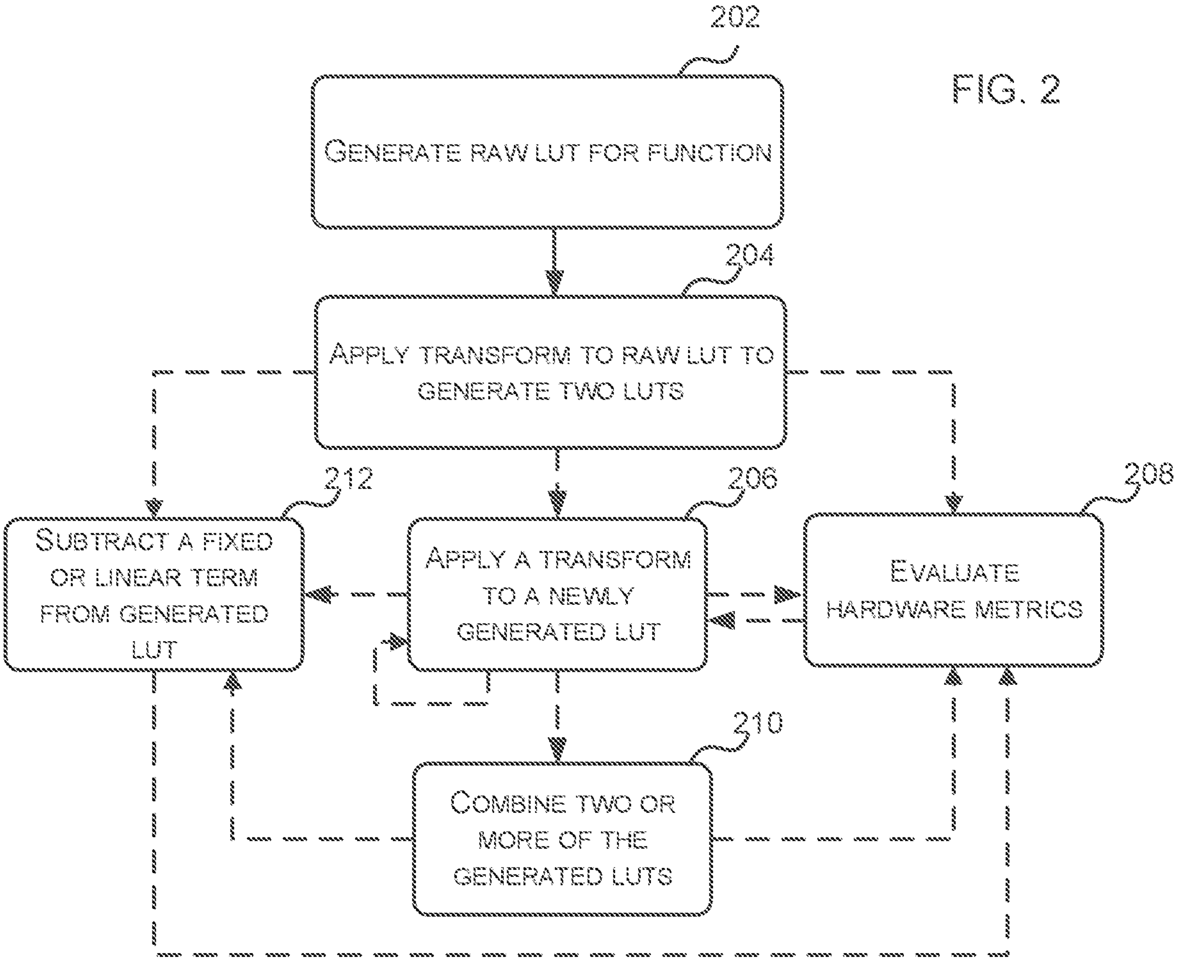
FIG. 2 is a flow diagram of a first example method of generating fixed-function hardware that implements a function.

| Coefficient LUT, D0 (expanded) |
|---|
| 0 |
| B − A |
| 0 |
| D − C |
| 0 |
| F − E |
| 0 |
| H − G |

Where the Haar wavelet is used and the method of FIG. 2 terminates having generated two LUTs (i.e. after block 204), the inverse transform to produce an output (y) of the LUT is, given by:

$$y = L1(x[M-1:1]) + (x[0] \times D0(x[M-1:1]))$$

where,

- x is an M-bit input where the M bits are denoted x[M−1:0] with x[0] being the LSB
- D0(x[M−1:1]) is shorthand notation to indicate the entry of table D0 indexed by the M−1 most significant bits (MSBs) of x
- (x[0]×D0(x[M−1:1])) is equal to D0(x[M−1:1]) when the least significant bit (LSB) of x (x[0]) is '1' and is otherwise zero
- L1(x[M−1:1]) is shorthand notation to indicate the entry of table L1 indexed by the M−1 MSBs of x It will be appreciated that where the LUTs are expanded so they comprise the same number of entries as the raw LUT, the inverse transform stays the same but entries in the LUT are indexed using all the bits of x and no logical operation is required to determine whether to add the coefficient from D0 or not (because where the LSB of x is 0, the value in the entry of D0 is 0).

Where a linear wavelet is used, the base LUT (L1) comprises alternate entries from the raw LUT (i.e. only the even entries from the raw LUT) and the first coefficient LUT (D0) comprises entries which are the difference between an odd entry from the raw LUT (e.g. B, D, . . . ) and the average of the values either side in the raw LUT, as shown in the example below:

| Raw LUT, L0 |
|---|
| A |
| B |
| C |
| D |
| E |
| F |
| G |
| H |

| Base LUT, L1 |
|---|
| A |
| C |
| E |
| G |

| Coefficient LUT, D0 |
|---|
| B − ((A + C)/2) |
| D − ((C + E)/2) |
| F − ((E + G)/2) |
| H − ((G + A)/2) |
| or H − G |

Where the linear wavelet is used it can be seen that the inverse transform is significantly more complicated than for the Haar wavelet because there is a more complex dependency between entries in the different LUTs (e.g. you need multiple reads from the base LUT, L1 to invert the transform). To reduce the complexity of the inverse transform, the base LUT, L1 may be split into two separate tables, one comprising the odd values of the base LUT, L1, and one comprising even values of the base LUT, L1, and this results in a single look up from each of the newly formed tables as shown below.

| Raw LUT, L0 |
|---|
| A |
| B |
| C |
| D |
| E |
| F |
| G |
| H |

| L1 (even) |
|---|
| A |
| E |

| L1 (odd) |
|---|
| C |
| G |

| Coefficient LUT, D0 |
|---|
| B − ((A + C)/2) |
| D − ((C + E)/2) |
| F − ((E + G)/2) |
| H − ((G + A)/2) or H − G |

Having generated the two LUTs (in block 204), these may be implemented in fixed-function hardware logic (e.g. as two separate blocks 102, 104, one for the base LUT, L1 and one for the first coefficient LUT, D0) along with an arithmetic unit 106 that performs the inverse transform, as shown in FIG. 1.

The method of FIG. 2 can be described with reference to an example. It will be appreciated that for the purposes of explanation, a simple example has been selected with a function that can be represented by a relatively small raw LUT; however, the method may be applied to much larger LUTs (e.g. in terms of number of entries and/or bits per entry). In this example, the input, x, is a 4-bit unsigned integer and the function being computed (i.e. the target function) is:

$$y = \left\lfloor \left(\frac{64}{32-x}\right)^2 \right\rfloor$$

The raw LUT comprises 16 4-bit entries (i.e. such that M=N=4 where as detailed above M is the width of the input in bits and N is the width of the output in bits) as shown below:

| Raw LUT, L0 |
|---|
| 4 |
| 4 |
| 4 |
| 4 |
| 5 |
| 5 |
| 6 |
| 6 |
| 7 |
| 7 |
| 8 |
| 9 |
| 10 |
| 11 |
| 12 |
| 14 |

Using the Haar wavelet for the function above, the expanded transform coefficients that are generated in each recursion (i.e. for each successive value of m, which is the level of recursion and starts at m=0), including redundant zero entries for each alternate entry (block), are given by:

$$d_m(x) = y\left(2^m\left\lfloor\frac{x}{2^m}\right\rfloor\right) - y\left(2^{m+1}\left\lfloor\frac{x}{2^{m+1}}\right\rfloor\right)$$

By applying the Haar wavelet to the table above, the single, raw LUT above is initially divided into two LUTs (in block 204): the base LUT, L1, and the coefficient LUT, D0, as shown below (in non-expanded form, i.e. without the redundant zero entries). The coefficient LUT, D0, contains the transform coefficients terms for m=0.

| L1 |
|---|
| 4 |
| 4 |
| 5 |
| 6 |
| 7 |
| 8 |
| 10 |
| 12 |

| D0 |
|---|
| 0 |
| 0 |
| 0 |
| 0 |
| 0 |
| 1 |
| 1 |
| 2 |

-continued

As shown above, each of the LUTs now comprises 8 entries, rather than the 16 entries of the first table and whilst the base LUT, L1, still requires 4-bits per entry, the coefficient LUT, D0, only requires 2-bits per entry. As described above, the inverse transform comprises, for even values of x, the respective value from L1 and for odd values of x, the sum of the respective values from L1 and D0, where in either case, the three MSBs of x can be used as the index to select the correct value from each LUT. If the four input bits of x are denoted x[3:0] with x[0] being the LSB, then the inverse transform can be implemented as:

$$y = L1(x[3:1]) + (x[0] \times D0(x[3:1]))$$

As noted above, whilst calculating an inverse transform (e.g. in arithmetic unit 106) relies upon looking up values in multiple LUTs, these may be performed substantially or often entirely in parallel. Furthermore, depending upon the nature of the transform used, the reconstruction operation may involve summation of terms (e.g. where Haar is used) or a more complex polynomial expression of the coefficients.

As shown in FIG. 2, there are many additional optimization steps which may be implemented with the first method (blocks 202 and 204) described above and any implementation may include none of these or any one or more of these optimization steps:

- Performing one or more recursion steps (block 206)
- Evaluating hardware metrics (block 208), where the metrics may depend on hardware area and/or latency
- Combining two or more of the newly generated LUTs into a composite LUT (block 210)
- Subtracting a fixed or linear term from one of the newly generated LUTs (block 212)

The first optimization listed above comprises performing additional recursive steps (block 206) which apply a transform (e.g. the same transform as in block 204 or a different transform) to one or both of the LUTs that have been previously generated (in block 204). By performing additional recursive steps (in block 206), additional LUTs are generated such that the method of FIG. 2 has converted a single, raw LUT (L0) for the target function into more than two LUTs, resulting in more than two LUT hardware logic blocks 102, 104 (i.e. one per resultant LUT) plus the arithmetic unit 106.

Referring back to the example above, the Haar wavelet may be applied to the larger of the two LUTs that were previously generated (i.e. to the base LUT, L1), thereby generating two new LUTs: a new base LUT, L2, and a second coefficients LUT, D1 (which comprises the transform coefficients for m=1). This increases the total number of LUTs to three—the new base LUT, L2 and two coefficient LUTs D0, D1:

| L2 |
|---|
| 4 |
| 5 |
| 7 |
| 10 |

| D0 |
|---|
| 0 |
| 0 |
| 0 |
| 0 |
| 0 |
| 1 |
| 1 |
| 2 |

| D1 |
|---|
| 0 |
| 1 |
| 1 |
| 2 |

As shown above, each of the two newly generated LUTs, L2, D1 only comprises 4 entries, rather than the 16 entries of the raw LUT (or 8 entries of L1, from which they were formed) and whilst the first new LUT, L2, still requires 4-bits per entry, the second LUT, D1, only requires 2-bits per entry. In this case, the inverse transform comprises (using the same notation as above):

$$y = L2(x[3:2]) + (x[1] \times D1(x[3:2])) + (x[0] \times D0(x[3:1]))$$

This may then be repeated (by repeating block 206), to apply a further recursive step to the base LUT, L2, resulting in:

| L3 |
|---|
| 4 |
| 7 |

| D0 |
|---|
| 0 |
| 0 |
| 0 |
| 0 |
| 0 |
| 1 |
| 1 |
| 2 |

| D1 |
|---|
| 0 |
| 1 |

-continued

| D1 |
|---|
| 1 |
| 2 |

| D2 |
|---|
| 1 |
| 3 |

As shown above, each of the newly generated LUTs, L3, D2 only comprise 2 entries, rather than the 16 entries of the raw LUT (or 4 entries of L2, from which they were formed). The new base LUT, L3, now only requires 3-bits per entry, whilst the second LUT, D2 (the third coefficient LUT), requires 2-bits per entry. In this case, the inverse transform comprises (using the same notation as above):

$$y = L3(x[3]) + (x[2] \times D2(x[3])) + (x[1] \times D1(x[3:2])) + (x[0] \times D0(x[3:1]))$$

This may then be repeated (by repeating block 206), to apply yet a further recursive step to the base LUT, L3, resulting in:

| L4 |
|---|
| 4 |

| D0 |
|---|
| 0 |
| 0 |
| 0 |
| 0 |
| 0 |
| 1 |
| 1 |
| 2 |

| D1 |
|---|
| 0 |
| 1 |
| 1 |
| 2 |

| D2 |
|---|
| 1 |
| 3 |

| D3 |
|---|
| 3 |

In this case, the inverse transform comprises (using the same notation as above):

$$y = L4 + (x[3]) \times D3) + (x[2] \times D2(x[3])) + (x[1] \times D1(x[3:2])) + (x[0] \times D0(x[3:1]))$$

Referring to the examples above and in particular the expressions for the inverse transforms, it can be seen how multiplexers may be used to select terms to include in the addition, with the multiplexers controlled by bits from the input value.

Looking back at the examples, it is clear that the method of FIG. 2 could terminate recursion having only generated one coefficient LUT, D0, or after generation of two, three or four coefficient LUTs. The decision of how many recursions to apply (and hence how many LUTs to implement in fixed-function hardware) may be made based on any factor. In some examples, as shown in FIG. 2, hardware metrics may be determined following each application of a transform (block 208) and the computed metric may be used to determine how many recursions (and hence how many LUTs) are used in the fixed-function hardware. These metrics may be generated using a synthesis tool or determined in any other manner. The hardware metrics may, for example, comprise the amount of area required to implement the LUTs in fixed-function hardware or a parameter which is indicative of the amount of area required (e.g. the number of bits in the LUTs, the number of non-zero entries or unique entries in the LUTs, etc.). In various examples, the metrics may be generated "in situ", i.e. as part of a more complex design which may need to satisfy overall constraints. Although not shown in FIG. 2, the metrics may be computed (in block 208) for the raw LUT (from block 202) as well as the derived LUTs (generated in block 204) to determine whether to use the methods described herein.

One of many different evaluations may be performed based on the determined hardware metrics to select a final (or base) level of recursion, for example:

- Recursion may stop when the hardware metrics (as determined in block 208) satisfy a predefined target (e.g. the hardware metric is below a predefined threshold)
- Recursion may be performed until the final base LUT comprises only one entry (or another pre-defined minimum number of entries) and then the hardware metrics for each level of recursion compared to determine the level of recursion that provides the best hardware metrics (e.g. smallest hardware area)
- Recursion may be performed to identify a level of recursion with at least a local optimum hardware metric (e.g. recursion may continue whilst the hardware metrics improve and until they reach a point where the metric gets worse, and then the final level of recursion may be the penultimate level performed)

Although in the examples above, the number of entries in the generated LUTs halve at each recursion, in some examples, the LUTs may be expanded after termination of the recursion and prior to implementing them in fixed-function hardware so that they all comprise the same number of inputs, as shown below:

| L4 |
|---|
| 4 |
| 4 |
| 4 |
| 4 |
| 4 |
| 4 |
| 4 |
| 4 |
| 4 |
| 4 |
| 4 |
| 4 |
| 4 |
| 4 |
| 4 |
| 4 |

| D0 |
|---|
| 0 |
| 0 |
| 0 |
| 0 |
| 0 |
| 0 |
| 0 |
| 0 |
| 0 |
| 0 |
| 0 |
| 1 |
| 0 |
| 1 |
| 0 |
| 2 |

| D1 |
|---|
| 0 |
| 0 |
| 0 |
| 0 |
| 0 |
| 0 |
| 1 |
| 1 |
| 0 |
| 0 |
| 1 |
| 1 |
| 0 |
| 0 |
| 2 |
| 2 |

| D2 |
|---|
| 0 |
| 0 |
| 0 |
| 0 |
| 1 |
| 1 |
| 1 |
| 1 |
| 0 |
| 0 |
| 0 |
| 0 |

-continued

| D2 |
|---|
| 3 |
| 3 |
| 3 |
| 3 |

| D3 |
|---|
| 0 |
| 0 |
| 0 |
| 0 |
| 0 |
| 0 |
| 0 |
| 0 |
| 3 |
| 3 |
| 3 |
| 3 |
| 3 |
| 3 |
| 3 |
| 3 |

The expansion of the number of terms in the LUTs simplifies the indexing of the LUTs since all are now indexed in the same way. In this case, the inverse transform comprises:

$$y = L4(x) + D3(x) + D2(x) + D1(x) + D0(x)$$

Using this simple example, it can be seen how each of the individual LUTs may be implemented efficiently in fixed-function hardware (although for more realistic, larger LUTs, the implementation is determined using a logic synthesis tool):

| | | | | |
|---|---|---|---|---|
| D0 | Unsigned | x[3] AND x[2] AND x[1] AND x[0] | & | x[3] AND (x[2] XOR x[1]) AND x[0] |
| D1 | Unsigned | x[3] AND x[2] AND x[1] | & | (x[3] XOR x[2]) AND x[1] |
| D2 | Unsigned | x[3] AND x[2] | & | x[2] |
| D3 | Unsigned | x[3] | & | x[3] |
| L4 | | 4 | | |
| y | | L4(x) + D3(x) + D2(x) + D1 (x) + D0(x) | | |

In the table above '&' indicates that bits are being concatenated and 'AND' is the Boolean operator.

In the example described above where, after recursion as stopped, all resultant LUTs are expanded to comprise the same number of entries, irrespective of which level of recursion the method stops at, the arithmetic unit 106 implements the inverse transform by summing one selected value from each of the LUTs.

Another optimization shown in FIG. 2 is that following the generation of a plurality of LUTs (in blocks 204 and 206), two or more of these LUTs may be combined to create a composite LUT. Where this optimization is used, the final fixed-function hardware still comprises at least two LUT hardware blocks; however, a hardware block need not implement either the base level LUT or one of the coefficient LUTs, but may implement a combination of two or more of the coefficient LUTs.

Referring back to the example above, the D2 and D3 LUTs may be combined and the result is:

| D0 |
|---|
| 0 |
| 0 |
| 0 |
| 0 |
| 0 |
| 0 |
| 0 |
| 0 |
| 0 |
| 0 |
| 0 |
| 1 |
| 0 |
| 1 |
| 0 |
| 2 |

| D1 |
|---|
| 0 |
| 0 |
| 0 |
| 0 |
| 0 |
| 0 |
| 1 |
| 1 |
| 0 |
| 0 |
| 1 |
| 1 |
| 0 |
| 0 |
| 2 |
| 2 |

| D2' = D2 + D3 |
|---|
| 0 |
| 0 |
| 0 |
| 0 |
| 1 |
| 1 |
| 1 |
| 1 |
| 3 |
| 3 |
| 3 |
| 3 |
| 6 |
| 6 |
| 6 |
| 6 |

| L4 |
|---|
| 4 |
| 4 |
| 4 |
| 4 |
| 4 |
| 4 |
| 4 |
| 4 |

-continued

| L4 |
| --- |
| 4 |
| 4 |
| 4 |
| 4 |
| 4 |
| 4 |
| 4 |
| 4 |

In this case, the inverse transform comprises:

$$y = L4(x) + D2'(x) + D1(x) + D0(x)$$

Using this simple example, it can be seen how each of the individual LUTs may be implemented efficiently in fixed-function hardware:

| | | | | |
| --- | --- | --- | --- | --- |
| D0 | Unsigned | x[3] AND x[2] AND x[1] AND x[0] | & | x[3] AND (x[2] XOR x[1]) AND x[0] |
| D1 | Unsigned | x[3] AND x[2] AND x[1] | & | (x[3) XOR x[2]) AND x[1] |
| D2' | Unsigned | x[3] AND x[2] & x[3] | & | x[3] XOR x[2] |
| L4 | | 4 | | |
| y | | L4(x) + D2'(x) + D1(x) + D0(x) | | |

To determine which of the coefficient LUTs to combine, various combinations may be calculated (in block 210) and the hardware metric of each combination evaluated (in block 208) and compared. In an example, where the recursion stops at the third level, i.e. L3, such that there are three coefficient LUTs, D0, D1, D2, then the following combinations may be evaluated and the option which results in the best hardware metrics selected:

| LUT 1 | LUT 2 | LUT 3 | LUT 4 |
| --- | --- | --- | --- |
| D0 | D1 | D2 | L3 |
| D0 + D1 | D2 | L3 | — |
| D0 + D1 + D2 | L3 | — | — |
| D0 | D1 + D2 | L3 | — |

Although the table above shows only adjacent levels (e.g. Dn and Dn+1) being combined, non-adjacent levels (e.g. D0+D3) may be combined. Furthermore, combinations may include combining one or more coefficient LUTs back with the base LUT (e.g. D0+L3).

Another optimization shown in FIG. 2 comprises subtracting a fixed or linear term from one of the newly generated LUTs (block 212), e.g. from the base LUT. This optimization can be described with reference to another example.

In this example, the input, x, is an F1.8.12 floating point value (1 sign bit, 8 exponent bits with a bias of 127, 12 mantissa bits) and the output, y, is an S8.12 signed fixed point value (8 integer bits, 12 fractional bits, where the function being computed (i.e. the target function) is:

$$y = \lfloor \log_2 |\lfloor x \rceil_{F1.8.12,FTO}| \rceil_{S8.12,RNP}$$

Where $\lfloor \bullet \rceil_{F1.8.12,FTO}$ defines a custom rounding operation "force to odd" (FTO), that replaces the mantissa of the input (thought of as an integer) with the nearest odd number no less than the original value. The expression $\lfloor \bullet \rceil_{S8.12,RNP}$ rounds the exact result to the S8.12 signed fixed point format, using round to nearest, with ties resolved in the positive direction. Since the floating-point value can be written as:

$$x(-1)^s \cdot 2^e \cdot (1 + a)$$

Where s is the sign, e is the exponent (without bias), a is the mantissa in the half open interval [0,1), and $$\log_2|x| = \log_2(2^e \cdot (1 + a)) = e + \log_2(1 + a)$$

Then the target function, y, comprises a portion that depends upon 11 bits of mantissa input (11 bits, rather than 12, as a consequence of the FTO rounding described above) and gives 12 bits of fractional output which can be encoded in a LUT, and an exponent integer portion that can be mapped directly to the output. This LUT in its raw form, is relatively large and comprises 2048 12-bit entries (i.e. with M=11 and N=12).

Figure 3:
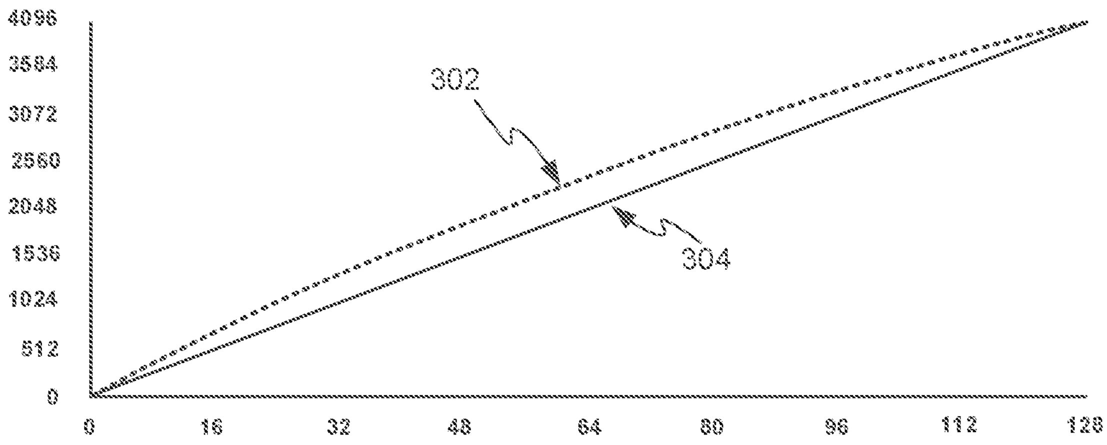
FIG. 3 shows a graph comparing values in a base look-up table and a linear term.
Figure 4:
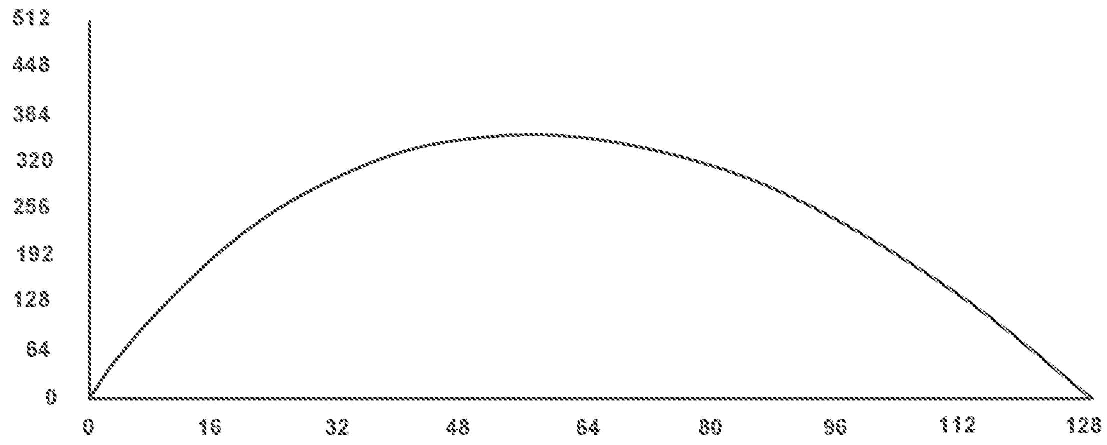
FIG. 4 shows a graph of the differences between the two traces in FIG. 3.

Using the method of FIG. 2 and a Haar wavelet transform, the coefficient LUTs (which may also be called Haar wavelet tables, where this transform is used) are significantly smaller than the raw input LUT:

D0 has 1024 2-bit entries
D1 has 512 3-bit entries
D2 has 256 4-bit entries
D3 has 128 5-bit entries And the base LUT (L4) also has 128 12-bit entries that are simply the original raw LUT sampled at intervals of $2^{7-11}=1/16$. As shown in the graph of FIG. 3, the L3 base LUT (curve 302) can be quite closely approximated by the 7 most significant bits of the input mantissa (straight line 304). The graph in FIG. 4 shows the difference between the curve 302 and straight line 304. Whilst the base LUT requires 12-bits per entry (values ranging from 0 to 4074), the difference LUT only requires 9-bits (values ranging from 0 to 354). Consequently, the linear term (represented by straight line 304) is subtracted from the values in the base LUT, L4 (in block 212).

The resulting hardware therefore comprises fixed-function hardware blocks implementing five LUTs: D0, D1, D2, D3, (L4-LT). The last of these, L4-LT represents the base level of the Haar wavelet transformation, after four levels of recursion, but with a linear term extracted from the result (as explained above with reference to FIGS. 3 and 4) and ignoring the exponent portion as this can be mapped directly to the output (as described above). The inverse transform comprises:

$$y = (L4 - LT) + LT + D3 + D2 + D1 + D0$$

where the linear term LT that is added back is a linear term that comprises the integer portion of the result (i.e. the exponent portion) concatenated with the 7 most significant bits of the mantissa (as subtracted from L4 for the reasons described above) with zeros in the remaining 5 bit positions (since the output has 12-bits of fractional precision). Again, the MSBs of the input, x, are used to index into the various LUTs, however, as described above, a consequence of the FTO rounding is that the least significant mantissa bit is always set to 1, and therefore does not affect the value of y. This bit may therefore be discarded to give a reduced size input word x' which can be used in place of x:

| | |
|---|---|
| D0 | D0 (x'[10:1]) when x'[0] = 1, else 0 |
| D1 | D1 (x'[10:2]) when x'[1] = 1, else 0 |
| D2 | D2 (x'[10:3]) when x'[2] = 1, else 0 |
| D3 | D3 (x'[10:4]) when x'[3] = 1, else 0 |
| (L4-LT) | (L4-LT) (x'[10:4]) |
| LT | Unsigned (NOT x'[18] & x'[17:4] & 00000) + 2**12 |

(where 2**12 = $2^{12}$). Note that the linear term given in the above table includes the exponent (subtracting the bias i.e. negating the exponent most significant bit and adding 1 to its least significant bit ($2^{12}$ when concatenated with the 12 fractional bits, interpreted as an integer)) as featured in the above definition of the logarithm (with a total of 8 integral bits and 12 fractional bits).

As shown in this example, a fixed or linear term may not only be subtracted from one of the generated LUTs, e.g. from the base LUT, but may in addition, or instead, be subtracted from the original, single LUT for the target function before the transform is applied (e.g. between blocks 202 and 204).

Figure 5:
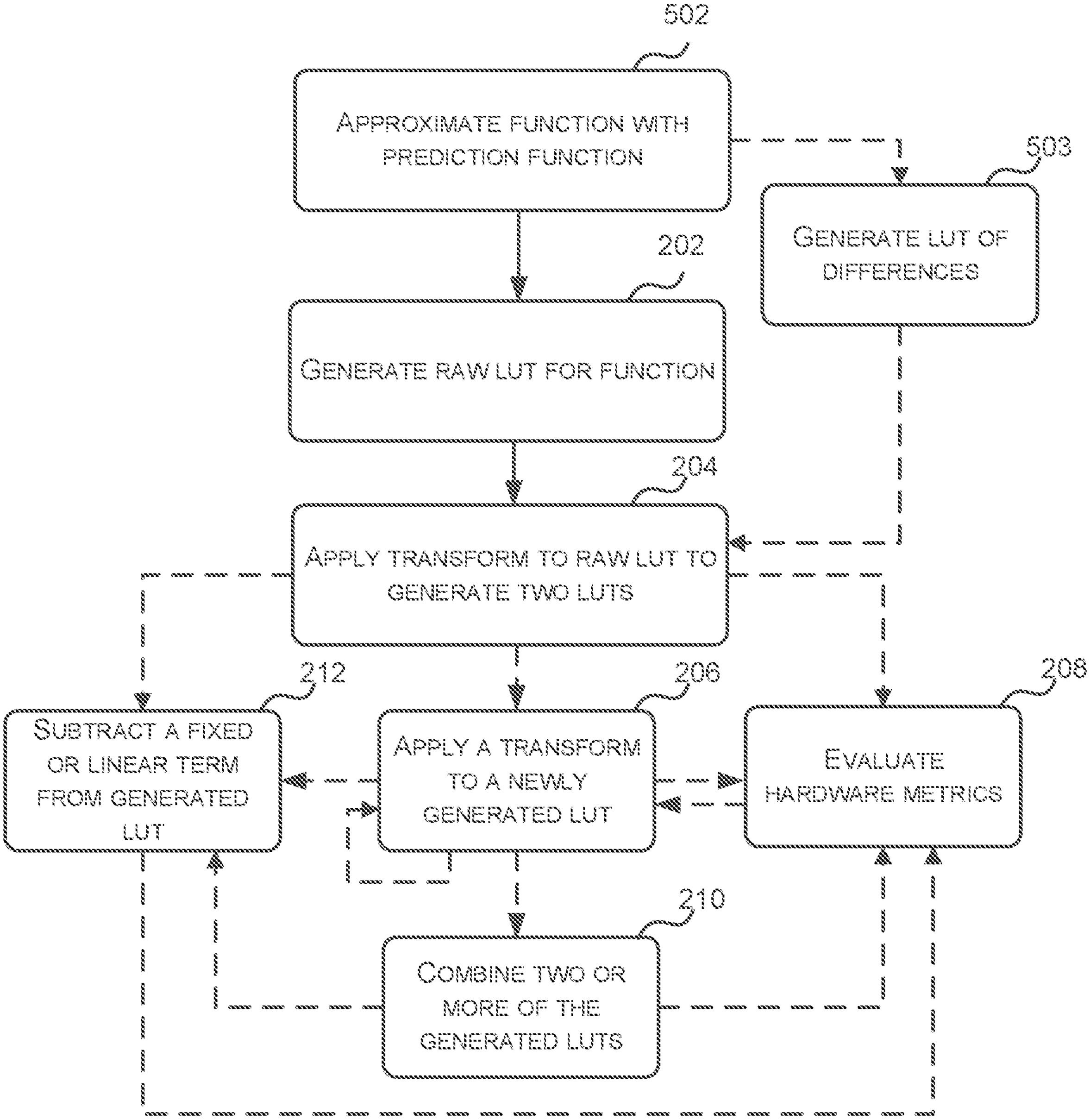
FIG. 5 is a flow diagram of a second example method of generating fixed-function hardware that implements a function which is a variation on that shown in FIG. 2.

In a variation of the methods described above with reference to FIG. 2, instead of generating the single, raw LUT for the target function (in block 202), a pre-processing step may first be used to approximate the target function with a different, simpler, function, which may be referred to as the 'prediction function' (block 502), as shown in FIG. 5. This pre-processing step may, for example, be used where using the methods described above, the resulting fixed-function hardware is still infeasibly large, e.g. because there are too many elements in the raw LUT for the target function or because each element is too wide (i.e. comprises a large number of bits), which may be a consequence of the required precision. Having approximated the target function with the prediction function (in block 502), a single, raw LUT for the prediction function is generated (block 202) and the method proceeds as described above but starting from the raw LUT for the prediction function, rather than the single raw LUT for the target function itself.

As with the method of FIG. 2, the output of the method of FIG. 5 may be fed into a logic synthesis tool or the method of FIG. 5 may be implemented within a logic synthesis tool.

In some examples where a prediction function is used as an approximation to the target function, the prediction function may be selected such that the differences between the prediction function and the target function are within a pre-defined, acceptable, error-bound (e.g. the error does not exceed 1 Unit of Least Precision (ULP) in the result) and so need not be considered.

Figure 6A:
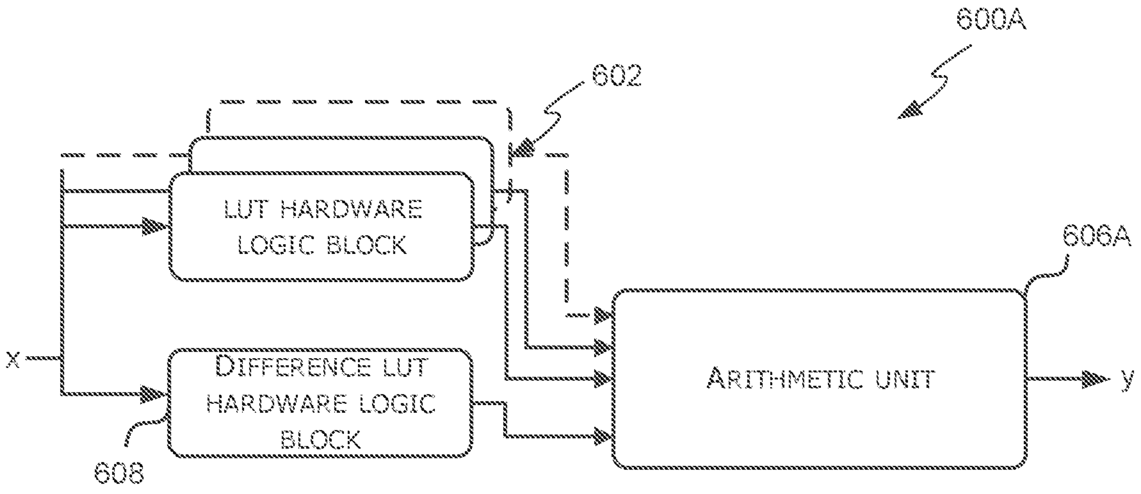
FIGS. 6A, 6B and 7 are schematic diagrams showing further examples of improved fixed-function hardware that implements a function.
Figure 6B:
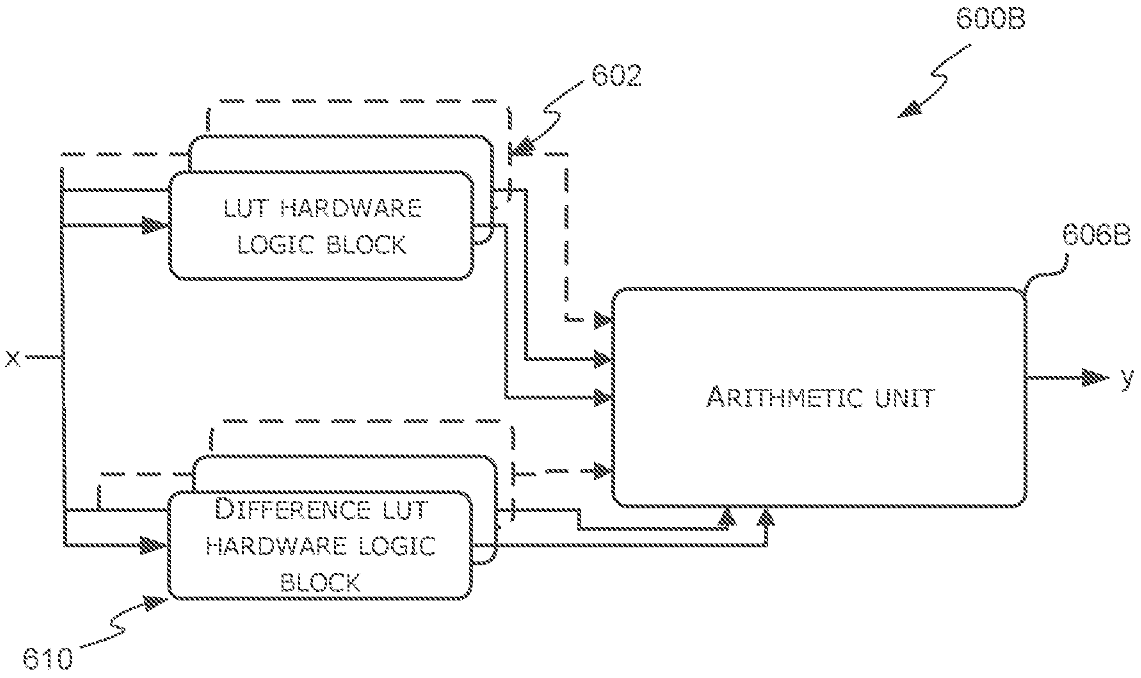

In other examples, a second LUT may be generated as part of the pre-processing step which comprises difference terms corresponding to each entry in the single LUT for the prediction function (block 503), i.e. each difference term is the difference between the predicted value, using the prediction function, and the actual value of the target function. This LUT of difference terms may be implemented in a single LUT hardware logic block 608 and then the relevant term added to the result of the inverse transform in the arithmetic unit 606A, as shown in FIG. 6A (where hardware logic 600A that implements the function also comprises the plurality of LUT hardware logic blocks 602, each corresponding to one of the LUTs generated from the raw LUT for the prediction function). Alternatively, the LUT of difference terms (generated in block 503) may be divided into two or more LUTs (each implemented in a separate LUT hardware logic block 610 within the hardware logic 600B) using the methods described above (i.e. the raw LUT of difference terms is fed into block 204) and then the arithmetic unit 606B may implement two inverse transforms, one to determine the value of the prediction function for a particular input value and the other to determine the difference value for the same particular input value and then the arithmetic unit 606B (or an additional logic unit) may sum these two values and output the value of the target function for the particular input value, as shown in FIG. 6B.

The use of the pre-processing step (block 502 and optionally block 503) can be described with reference to a third example. In this example, the target function, which is to be evaluated at relatively high precision (i.e. such that it is prohibitive to tabulate the function directly using a LUT) is:

$$f(x) = \frac{2}{1+x}$$

This function may be approximated by linearly interpolating pairs of adjacent points ($x_n$,f($x_n$)) on the curve by considering the following equation:

$$\begin{aligned} f(x) &= f((1-t)x_n + x_{n+1}t) \\ &= \frac{2}{1+(1-t)x_n + x_{n+1}t} \\ &= \frac{2}{1+x_n}(1-t) + \frac{2}{1+x_{n+1}}t - \frac{2(x_{n+1}-x_n)^2}{(1+x)(1+x_n)(1+x_{n+1})}t(1-t) \\ &= f(x_n)(1-t) + f(x_{n+1})t - \frac{2(x_{n+1}-x_n)^2}{(1+x)(1+x_n)(1+x_{n+1})}t(1-t) \end{aligned}$$

Where t is an interpolation parameter in the open interval (0,1). Since the first two terms in the last line are the expression for the linear interpolation of the function at points $x_n$ and $x_{n+1}$, the last term provides a bound on the linear approximation error:

$$\varepsilon < \frac{1}{2}(x_{n+1} - x_n)^2$$

since each of the products in the denominator of the 'error' term are bounded below by one and the product t(1−t) has its maximum at t=0.5. By selecting an appropriate spacing for adjacent points on the x-axis ($x_n$ and $x_{n+1}$) based on the target precision of the output (which may be defined in terms of a number, N, of fractional bits), then the error term may be kept below 1 ULP and an LUT of difference terms may not be created (i.e. block 503 may be omitted).

Figure 8:
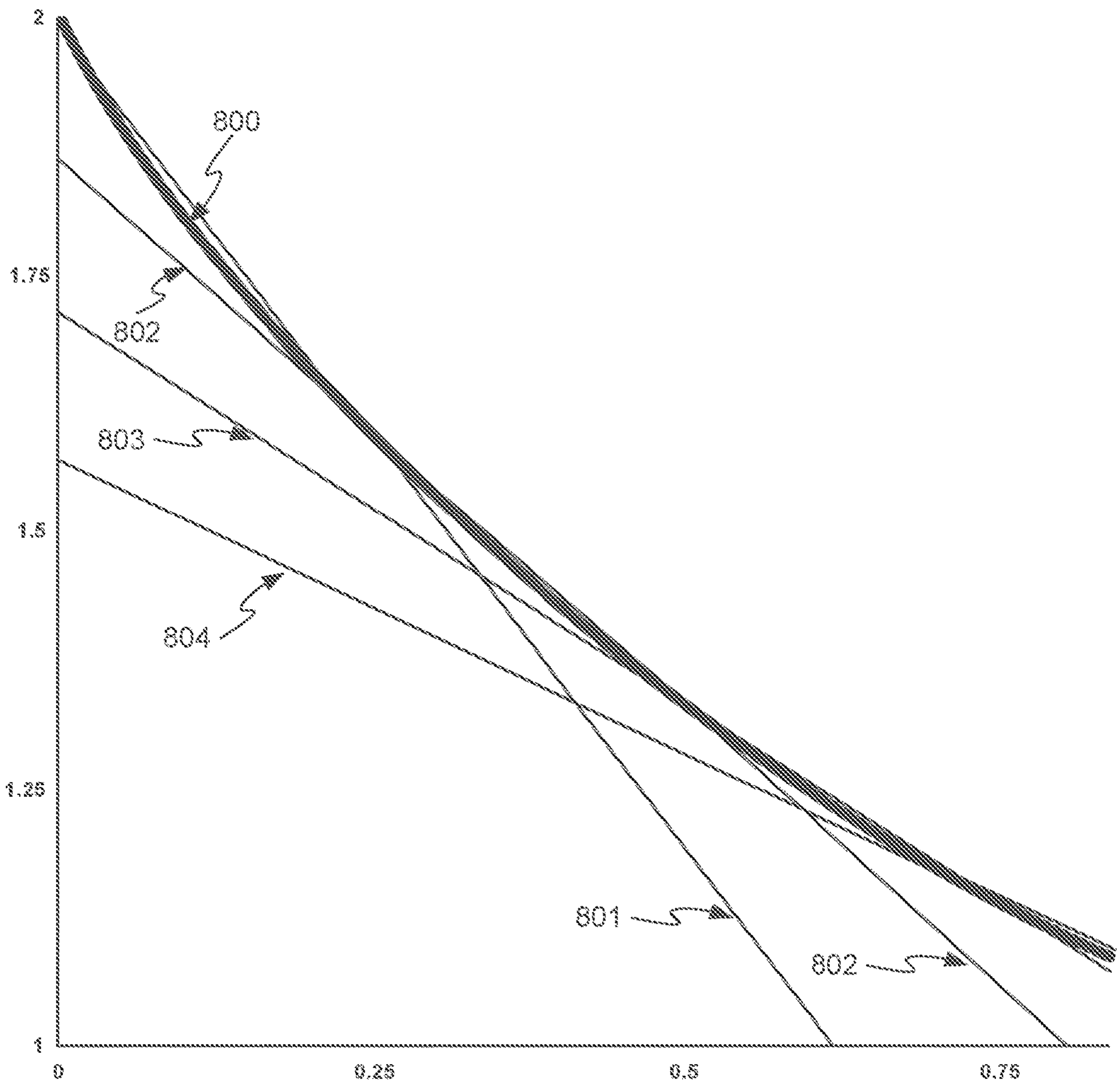
FIG. 8 is a graph showing how a prediction function may be used.

FIG. 8 shows the approximation of the target function f(x) 800 (shown by the thick curve in FIG. 8) by four secants 801-804 defined by pairs of points ($x_n$,f($x_n$)) and ($x_{n+1}$, f($x_{n+1}$)) where $x_n$=n/4. It can be seen from FIG. 8 that the maximum error bound depends upon the spacing of the points along the x-axis.

Given a target precision of N fractional (or mantissa) bits, then a spacing of the points may be selected to be:

$$x_{n+1} - x_n = 2^{-\lceil \frac{N}{2} \rceil}$$

where the ceiling function is used to provide enough headroom for further rounding error when N is odd. Given this:

$$x_n = n \cdot 2^{-\lceil \frac{N}{2} \rceil} \text{ where } n \in \left[0, 2^{\lceil \frac{N}{2} \rceil}\right]$$

And hence there are $2^{\lceil N/2 \rceil}+1$ sample points and hence $2^{\lceil N/2 \rceil}+1$ entries in the single, raw LUT that is generated for the prediction function. If the input x is encoded with M bits of fractional precision, then $x_n$ is identified from the most significant $$\left\lceil \frac{N}{2} \right\rceil$$

bits of x and the interpolation parameter, t, is identified from the remaining $$M - \left\lceil \frac{N}{2} \right\rceil$$

least significant bits of x.

Figure 7:
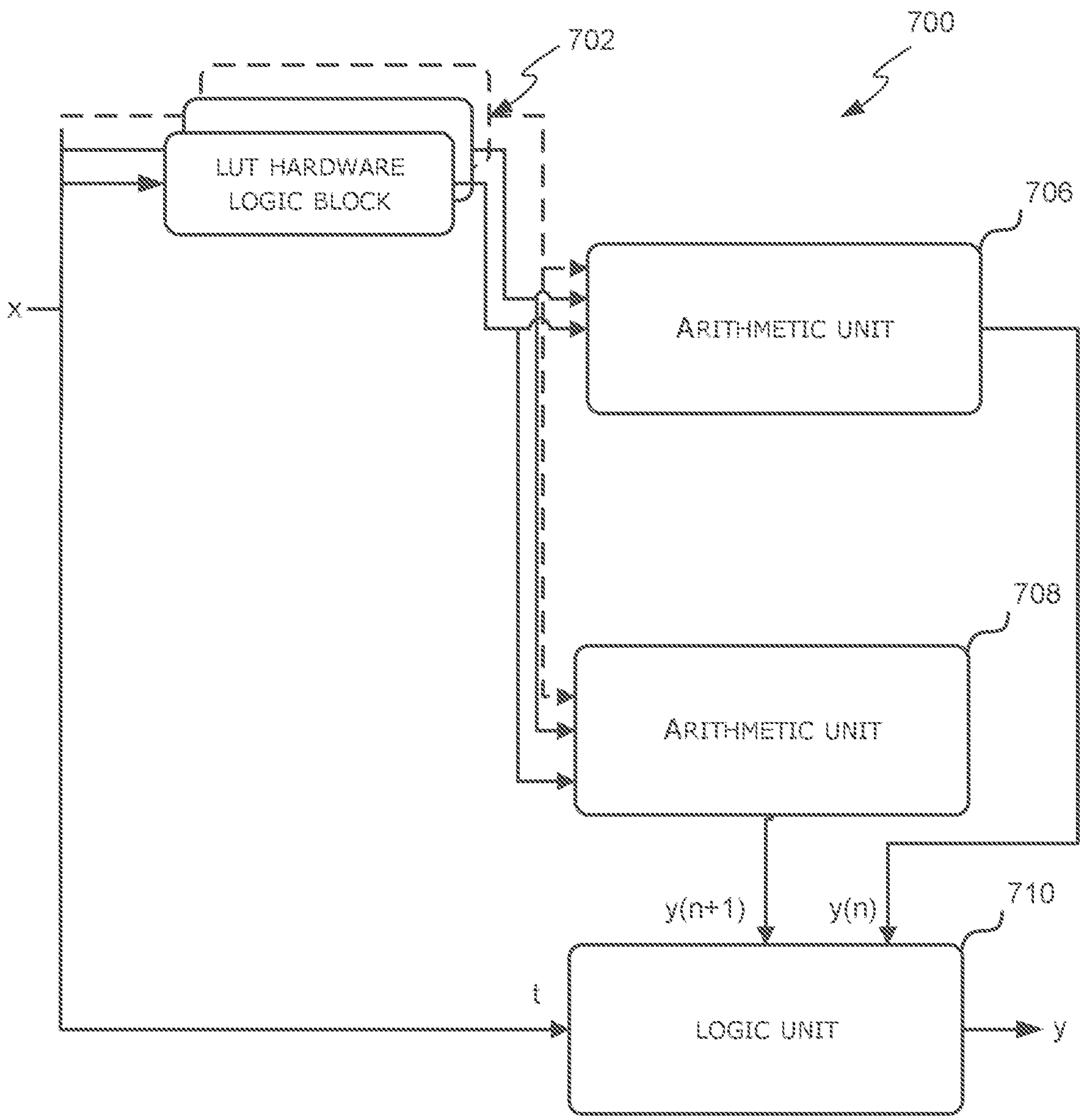

Given this, the prediction function that is used to approximate the target function may be, for example, given by:

$$y = 1 + \lfloor y_n - (y_n - y_{n+1}) \cdot t \rceil_{U1.N}$$

Where $y_n = \lfloor f(x_n) - 1 \rceil_{U1.(N+1)}$ (where the −1 is an encoding convenience because the function is in the interval (1,2]) and $\lfloor \bullet \rceil_{Ua.b}$ indicates the output of an exact operation has been rounded to an unsigned fixed point format with a integral bits of precision and b fractional bits of precision. In this example, N+1 precision has been chosen for the LUT so that additional error in the linear interpolation rounding can be accommodated without exceeding the error target for the overall result. A single, raw LUT for $y_n$ may be generated (in block 202) and fed into the subsequent steps in the methods described above to generate a plurality of LUTs which can be implemented more efficiently in hardware logic. In such an example, the fixed-function hardware 700 that implements the prediction function and is shown in FIG. 7 comprises, in addition to the plurality of LUT hardware blocks 702, each corresponding to an LUT generated from the single, raw LUT for $y_n$, a first arithmetic unit 706 that performs the inverse transform to generate $y_n$, a second arithmetic unit 708 that performs the inverse transform to generate $y_{n+1}$ and a logic unit 710 that generates the result, y. This final logic unit 710 receives as inputs, the values output by the two arithmetic units 706, 708 and at least the $$M - \left\lceil \frac{N}{2} \right\rceil$$

least significant bits of x from which the interpolation parameter, t, is identified.

Figure 9:
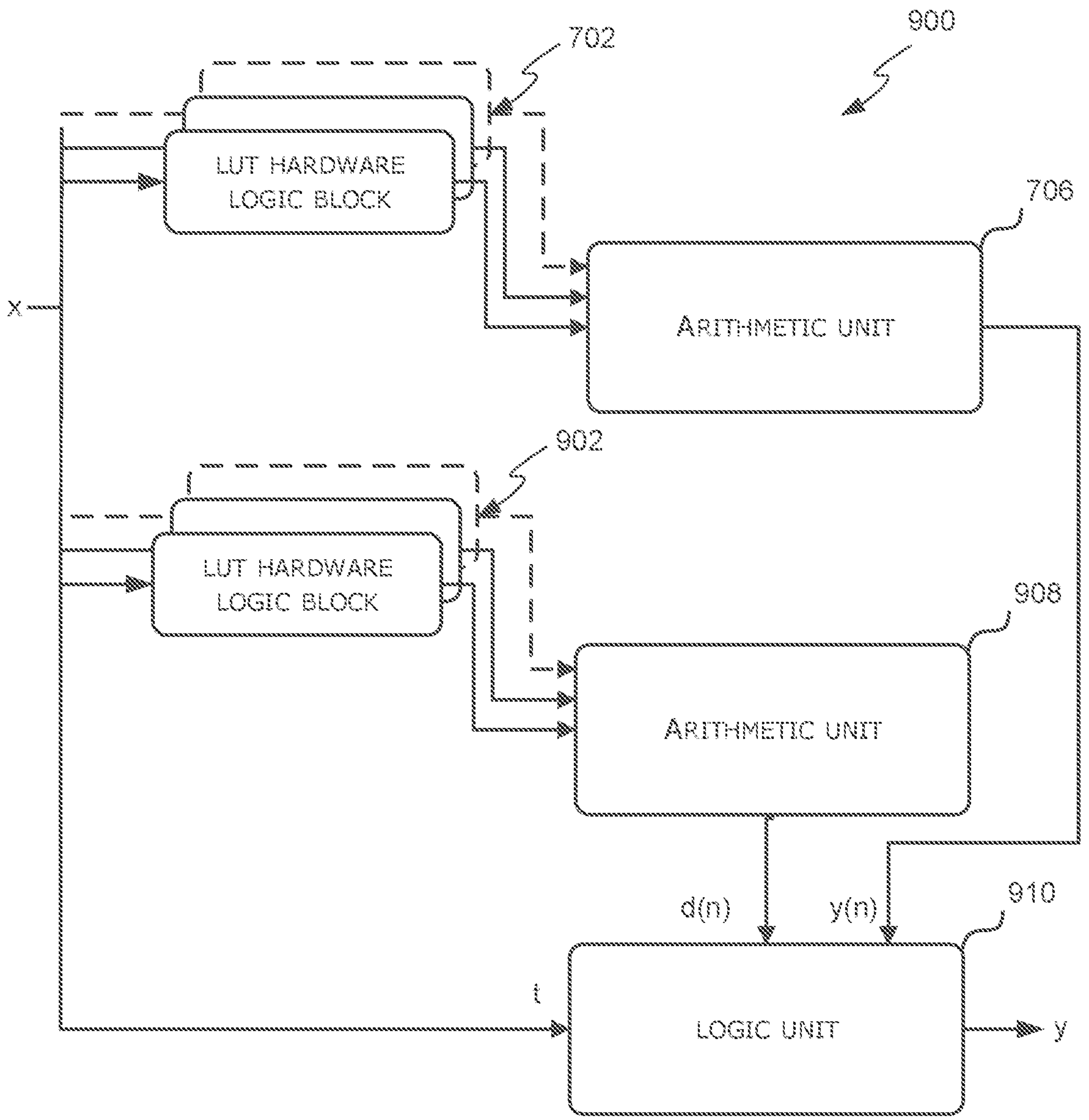
FIG. 9 is a schematic diagram showing another example of improved fixed-function hardware that implements a function.

The prediction function above requires two look-ups in the LUTs 702, one for $y_n$ and one for $y_{n+1}$ and the second of these look-ups requires the index to be offset by one (i.e. to obtain the value of $y_{n+1}$). Consequently, in a variation on the methods described above, the pre-processing step (block 502) may result in the subsequent steps in the method being performed separately in relation to two raw LUTs. These two raw LUTs may comprise one for $y_n$ and a rotated version of the same LUT for $y_{n+1}$; however, as this still requires calculation of $y_n - y_{n+1}$, the two raw LUTs may instead comprise one for $y_n$ and one for $d_n$, where $d_n = y_n - y_{n+1}$. This results in hardware logic 900 that implements the prediction function, y, as shown in FIG. 9, instead of as shown in FIG. 7. As can be seen in FIG. 9, there is a second set of LUT hardware logic blocks 902, which implement the LUTs generated from the raw LUT for $d_n$ and the second arithmetic unit 908 takes inputs from these LUT hardware logic blocks and performs the inverse transform to calculate $d_n$. The final logic unit 910 receives as inputs, the values output by the two arithmetic units 706, 908 and at least the $$M - \left\lceil \frac{N}{2} \right\rceil$$

least significant pits or x from which the interpolation parameter, t, is identified.

In an alternative implementation, as described in relation to the simple linear transform example above, to avoid two look-ups in the same LUT, the LUT may be split into two (one comprising even entries and the other comprising odd entries) and then only a single look-up is required from any one LUT.

As described above, one of the transforms that may be used (in blocks 204, 206) may be the Haar wavelet transform, which may be written:

$$l_{m+1,n} = l_{m,2n} \quad d_{m,n} = l_{m,n} - l_{m+1,\lfloor \frac{n}{2} \rfloor}$$

where m refers to the level of recursion and hence the $m^{th}$ table (with the base level being m=0) and n refers to the entry in the table, the $n^{th}$ entry (with the first entry being n=0) and the coefficient terms, $d_{m,n}$, including the zero terms (i.e. every even term). As described above, multiple adjacent levels may be combined:

$$l_{m+1,n} = l_{m,2^{w(m)}n} \quad d_{m,n} = l_{m,n} - l_{m+1,\lfloor \frac{n}{2^{w(m)}} \rfloor}$$

where w(m) counts the number of combined levels in the $m^{th}$ table.

In some examples, the transform below may be used to provide K differentiated tables (indicated by the superscript k):

$$l_{0,n}^{k+1} = l_{0,n+1}^{k} - l_{0,n}^{k} \text{ where } l_{0,n}^{0} = l_{0,n}$$

is the $n^{th}$ entry of the original LUT. As implied above, the encoding of one or more differentiated tables allows some form of polynomial interpolation to be applied between LUT entries, thereby effectively increasing the resolution (i.e. the input precision), without having to dramatically increase the size of the LUT (albeit potentially sacrificing accuracy/control over intermediate values). Transforms, such as above, may then be applied to one or more of the differentiated tables so that:

$$l_{m+1,n}^{k} = l_{m,2^{w(m)}n}^{k} \quad d_{m,n}^{k} = l_{m,n}^{k} - l_{m+1,\left\lfloor \frac{n}{2^{w(m)}} \right\rfloor}^{k}$$

where again m is used to refer to the level of recursion and n is used to refer to the entry number for the $$k^{th}\ LUT\ l_{m,n}^{k}$$

and derived (e.g. Haar) coefficients table $$d_{m,n}^{k}$$

Note that here w(m) is not a function of k, such that consistent level combinations are applied across transformed differentiated tables, but in some examples, it may be useful to combine levels independently.

In some examples, the transform coefficients of the table $$l_{m,n}^{k+1}$$

may be used to assist in the encoding of table $$l_{mn}^{k},$$

using a form of integration technique, as given by the following equation:

$$l_{m,n}^{k} = l_{m+1,\left\lfloor \frac{n}{2^{w(m)}} \right\rfloor}^{k} + l_{m+1,\left\lfloor \frac{n}{2^{w(m)}} \right\rfloor}^{k+1} \cdot \left(n \bmod 2^{w(m)}\right) + \sum_{i=0}^{\left(n\ mod\ 2^{w(m)}\right)-1} d_{m,i}^{k+1}$$

In the above, the first term is the $k^{th}$ differentiated $$LUT\ l_{m,n}^{k}$$

sampled at intervals of $2^{w(m)}$, the second term is the next differentiated $$LUT\ l_{m,n}^{k+1}$$

sampled at intervals of $2^{w(m)}$, extrapolated linearly over this interval, and the final term is the integrated residual (e.g. Haar when w(m)=1) coefficients $$d_{m,n}^{k+1}$$

of the differentiated LUT (which may be pre-computed in a LUT of its own). As is implied from the above expressions, the individual terms can be further decomposed into subsequent wavelet/differential recursion levels and/or further differentiated tables (with potentially higher order extrapolation terms).

Figure 10:
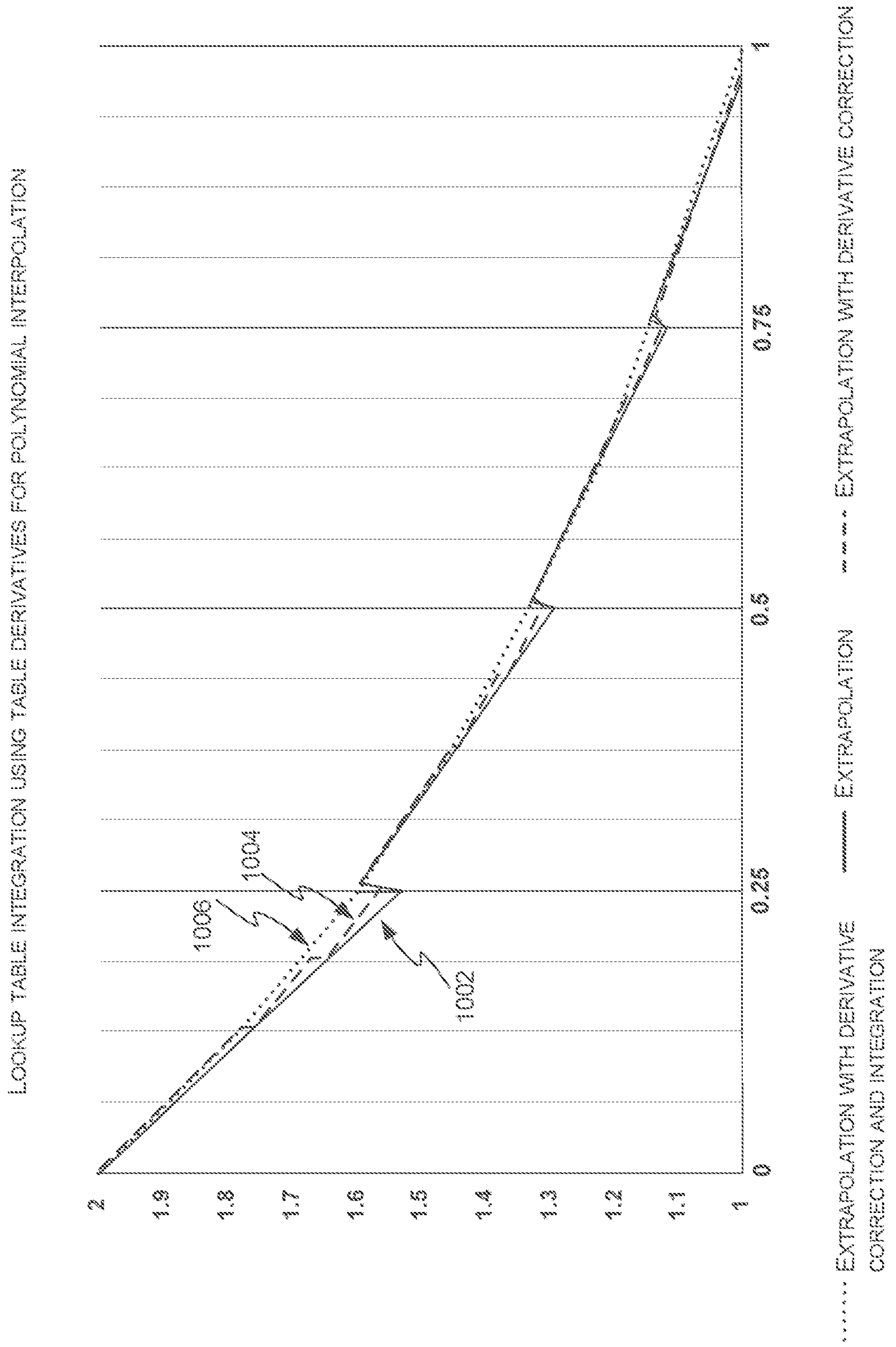
FIGS. 10 and 11 are graphs showing different implementations of the methods described herein.

In one example, which can be described with reference to the graph in FIG. 10 the inverse transform, making use of the above, comprises:

$$\begin{aligned} y &= l_{0,n}^{0} + l_{0,n}^{1} \cdot t \\ &= l_{0,n}^{0} + \left(l_{1,\left\lfloor \frac{n}{4} \right\rfloor}^{1} + d_{0,n}^{1}\right) \cdot t \\ &= l_{1,\left\lfloor \frac{n}{4} \right\rfloor}^{0} + l_{1,\left\lfloor \frac{n}{4} \right\rfloor}^{1} \cdot ((n \bmod 4) + t) + d_{0,n}^{1} \cdot t + \sum_{i=0}^{(n\ mod\ 4)-1} d_{0,i}^{1} \end{aligned}$$

where two adjacent levels of Haar transform of the first differentiated table have been combined (w(0)=2) and no further recursion has been applied. Note that the base level of the transformed differentiated LUT is used in both the extrapolation prediction of the original LUT and the interpolation between adjacent LUT entries. The effect of adding the different terms in the final expression is shown in the graph of FIG. 10. The first curve 1002 shows the subsampled function (the first term) and derivative tables, extrapolated over the extended interval (the second term). The second curve 1004 additionally includes the correctly reconstructed derivative used for linear interpolation at the original resolution (the third term). The third curve 1006 also includes the previous derivative correction terms summed to generate correct function LUT values at the original resolution (the fourth term).

Figure 11:
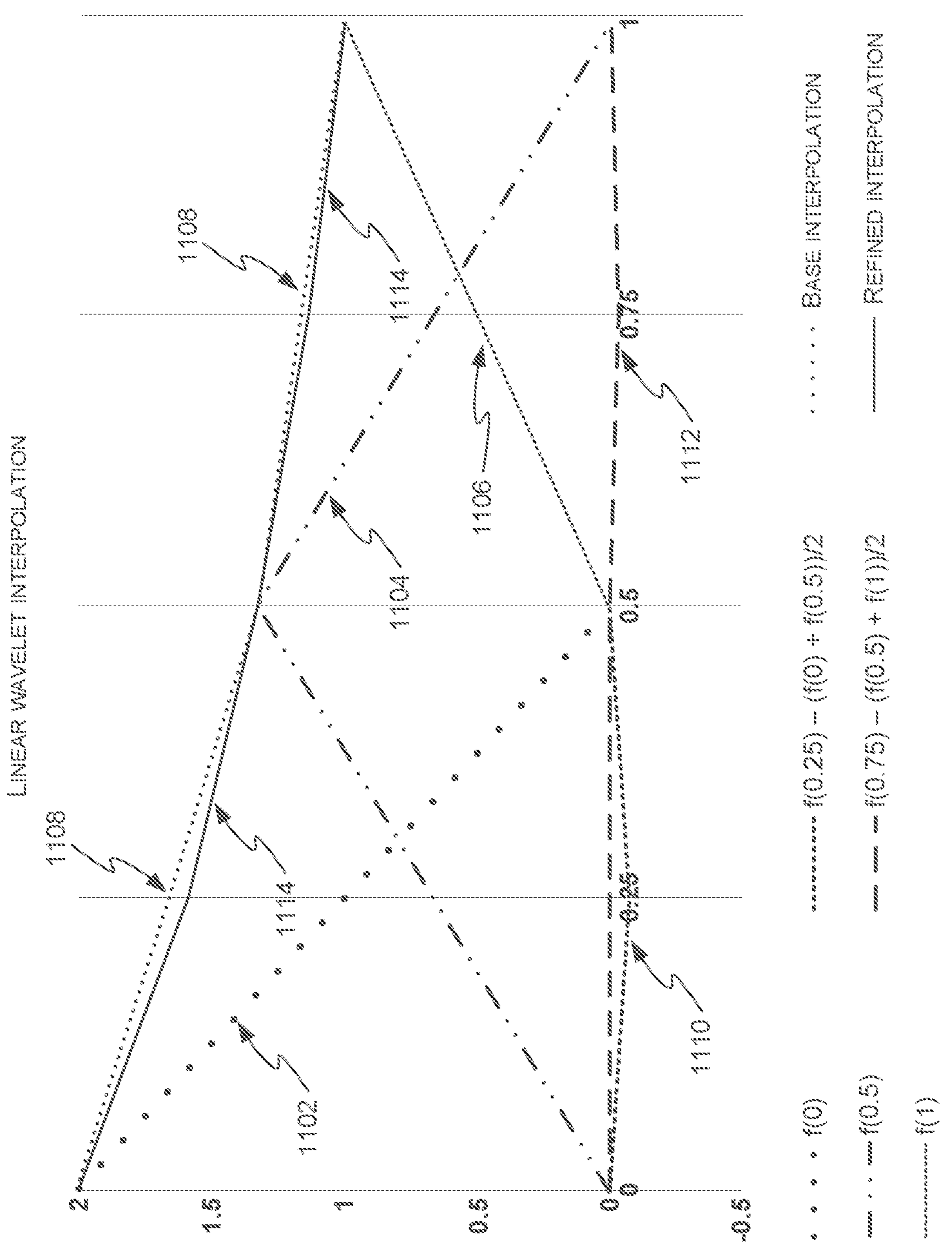

In an alternative example, shown in FIG. 11, the discrete wavelet transform is extended into the continuous domain. FIG. 11 shows three tent functions 1102, 1104, 1106 generated by initially applying the transform (in block 204) and the inverse transform may comprise linearly interpolating between them (as shown by line 1108) and then combining that with the difference terms given by tent functions 1110, 1112 to provide the refined interpolation 1114. In this example, the additive wavelet terms are multiplied by their interpolating weight before summing, rather than adding all wavelet terms and then interpolating. This method allows the linear wavelet transform coefficients to be used directly with a linear interpolation prediction function (as defined in block 502) without having to separately reconstruct two neighbouring values $y_n$ and $y_{n+1}$.

In examples in which the discrete wavelet transform has been extended into the continuous domain, the inverse transform is given by:

$$y = L_{0,\left\lfloor \frac{n}{2^{\mu}} \right\rfloor}^{0} + L_{0,\left\lfloor \frac{n}{2^{\mu}} \right\rfloor}^{1} \cdot \left(\frac{(n \bmod 2^{\mu}) + t}{2^{\mu}}\right) + \sum_{m=0}^{\mu-1} d_{m,\left\lfloor \frac{n}{2^{m+1}} \right\rfloor} \cdot \left(1 - \left|\frac{\left(n \bmod 2^{m+1}\right) + t}{2^{m}} - 1\right|\right)$$

where the linear wavelet coefficients, $d_{m,n}$, are given in terms of the $m^{th}$ base LUT coefficients, $l_{m,n}$ (defined as in the Haar example, except that an additional boundary value $l_{m,2^{M-m}}$ (representing f(1)) is included for each level), by:

$$d_{m,n} = l_{m,2n+1} - \frac{1}{2}(l_{m,2n} + l_{m,2n+2})$$

and the terms $$L^0_{0,n}$$

and $$L^1_{0,n}$$

represent the coarse tables (i.e. after μ stages of recursions, where μ≤M), given by:

$$L^0_{0,n} = l_{\mu,n} \quad L^1_{0,n} = l_{\mu,n+1} - l_{\mu,n}$$

which it may be noted, as in other examples, can be recursively encoded using the previous method for optimisation where both a table and its derivatives are present.

In many examples described above, the number of entries (or number of bits) in each of the plurality of derived LUTs may be smaller than the single, original raw LUT for the target or prediction function. In other examples, the LUTs may be of similar size but in a form that can be implemented in hardware in a less complex manner, e.g. the derived LUTs may comprise fewer discrete/different values, fewer non-zero bits, etc.

By using the methods described herein, LUTs may be used to implement many more functions in fixed-function hardware than would otherwise be feasible/practical (e.g. as a result of constraints of hardware size or power consumption). Use of LUTs provides many benefits including low latency and a fully specified accuracy.

The arrangement of hardware that implements the target function using the techniques described herein may provide additional benefits when it is integrated with other hardware in a processor. For example, the final hardware logic unit within the hardware implementing the function (e.g. arithmetic unit 106, 606A, 606B, logic unit 710, 910) may generate the bits of the output result sequentially (e.g. starting with the LSB) and these may be fed into subsequent hardware logic blocks (e.g. into a subsequent arithmetic block) in advance of determination of the full result (e.g. all the bits of the value of f(x) for an input x), thereby further reducing the latency of the overall hardware arrangement.

In the description above, it is assumed that the function to be implemented in the LUT is known at the outset and that the actual values of the function, in the form of the LUT, are used to transform the LUT and to evaluate the resultant hardware metrics (in block 208). In other examples, the techniques described above may also be applied to an LUT which is not known in advance but where characteristics of the LUT are known, e.g. the number of bits in each entry in the original LUT, the target accuracy for the output values, a bound on the differences between entries etc. In particular, it may be possible to impose some bounds on the number of bits N of output precision for each of the plurality of tables generated by the above methods such that a fixed transform may be determined a priori and then the best approximating entries selected for a target function based on the given constraints.

Figure 12:
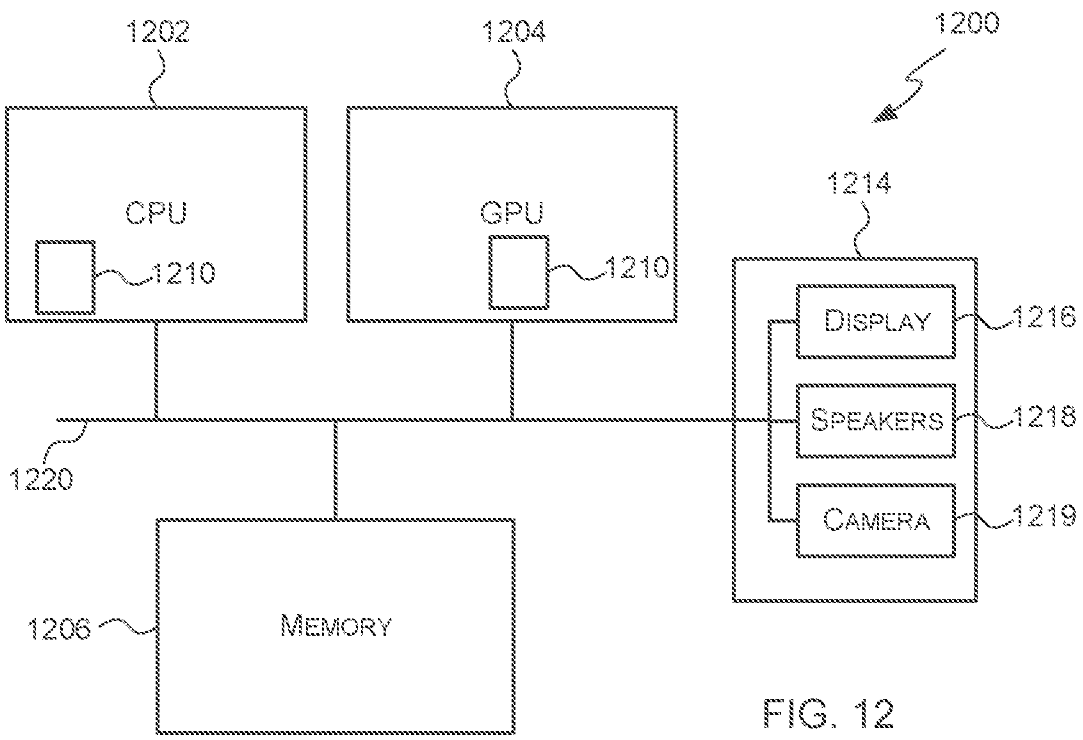
FIG. 12 shows a computer system in which a graphics processing system is implemented.

FIG. 12 shows a computer system in which the fixed-function hardware described herein may be implemented. The computer system comprises a CPU 1202, a GPU 1204, a memory 1206 and other devices 1214, such as a display 1216, speakers 1218 and a camera 1219. The fixed-function hardware 1210 described herein may be implemented within the CPU 1202 and/or the GPU 1204. The components of the computer system can communicate with each other via a communications bus 1220.

The hardware logic of FIGS. 1, 6A, 6B, 7 and 9 are shown as comprising a number of functional blocks. This is schematic only and is not intended to define a strict division between different logic elements of such entities. Each functional block may be provided in any suitable manner. It is to be understood that intermediate values described herein as being formed by a logic block need not be physically generated by the logic block at any point and may merely represent logical values which conveniently describe the processing performed by the logic block between its input and output.

The fixed-function hardware described herein may be embodied in hardware on an integrated circuit. The fixed-function hardware described herein may be configured to perform any of the methods described herein. Generally, any of the functions, methods, techniques, or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block, or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language, or a scripting language. Executable code includes binary code, machine code, bytecode, code defining an integrated circuit (such as a hardware description language or netlist), and code expressed in a programming language code such as C, Java, or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a fixed-function hardware configured to perform any of the methods described herein, or to manufacture a fixed-function hardware comprising any apparatus described herein. An integrated circuit definition dataset may be, for example, an integrated circuit description.

Therefore, there may be provided a method of manufacturing, at an integrated circuit manufacturing system, a fixed-function hardware as described herein. Furthermore, there may be provided an integrated circuit definition dataset that, when processed in an integrated circuit manufacturing system, causes the method of manufacturing a fixed-function hardware to be performed.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a fixed-function hardware will now be described with respect to FIG. 13.

Figure 13:
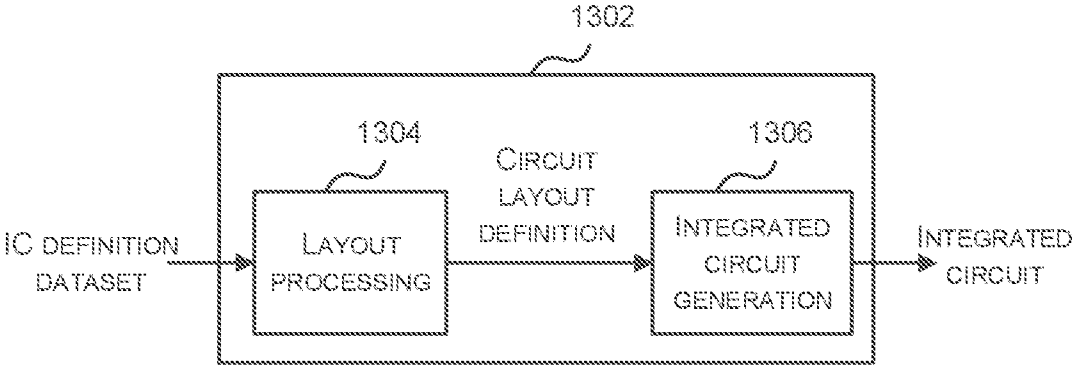
FIG. 13 shows an integrated circuit manufacturing system for generating an integrated circuit embodying a graphics processing system.

FIG. 13 shows an example of an integrated circuit (IC) manufacturing system 1302 which is configured to manufacture fixed-function hardware as described in any of the examples herein. In particular, the IC manufacturing system 1302 comprises a layout processing system 1304 and an integrated circuit generation system 1306. The IC manufacturing system 1302 is configured to receive an IC definition dataset (e.g. defining fixed-function hardware as described in any of the examples herein), process the IC definition dataset, and generate an IC according to the IC definition dataset (e.g. which embodies fixed-function hardware as described in any of the examples herein). The processing of the IC definition dataset configures the IC manufacturing system 1302 to manufacture an integrated circuit embodying fixed-function hardware as described in any of the examples herein.

The layout processing system 1304 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1304 has determined the circuit layout it may output a circuit layout definition to the IC generation system 1306. A circuit layout definition may be, for example, a circuit layout description.

The IC generation system 1306 generates an IC according to the circuit layout definition, as is known in the art. For example, the IC generation system 1306 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1306 may be in the form of computer-readable code which the IC generation system 1306 can use to form a suitable mask for use in generating an IC.

The different processes performed by the IC manufacturing system 1302 may be implemented all in one location, e.g. by one party. Alternatively, the IC manufacturing system 1302 may be a distributed system such that some of the processes may be performed at different locations and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture fixed-function hardware without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 13 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 13, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget."

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of implementing a function in fixed-function hardware, the method comprising:
- generating a look-up table, LUT, representing the function;
- applying a transform to the LUT to transform the LUT into a plurality of derived LUTs; and
- generating a hardware design implementing each of the derived LUTs in fixed-function hardware logic and further implementing an inverse transform to generate an output value by selectively combining one or more values output from the fixed-function hardware logic dependent on the input value.

2. The method according to claim 1, wherein the transform is applied recursively to the LUT.

3. The method according to claim 1, further comprising:
- after performing one or more recursions, evaluating hardware metrics for the plurality of derived LUTs; and
- selectively performing a further recursion dependent upon the evaluation.

4. The method according to claim 1, wherein the plurality of derived LUTs comprises at least three LUTs and the method further comprising:
- combining two or more of the derived LUTs to form a new derived LUT.

5. The method according to claim 1, further comprising:
- subtracting a fixed or linear term from a derived LUT to form a new derived LUT.

6. The method according to claim 1, wherein generating a look-up table, LUT, representing the function comprises:
- approximating the function with a different, prediction function; and
- generating a LUT representing the prediction function.

7. The method according to claim 6, wherein generating a look-up table, LUT, representing the function further comprises:
- generating a LUT of differences between the function and the prediction function.

8. The method according to claim 7, further comprising:
- implementing the LUT of differences in fixed-function hardware logic.

9. The method according to claim 7, further comprising:
- applying a transform to the LUT of differences to transform the LUT of differences into a plurality of derived difference LUTs; and
- implementing each of the derived difference LUTs in fixed-function hardware logic.

10. The method according to claim 1, wherein the LUT representing the function comprises a LUT that approximates the function.

11. The method according to claim 1, wherein generating a look-up table, LUT, representing the function comprises:
- generating a LUT based on pre-defined characteristics of the function.

12. The method according to claim 1, wherein the transform is a Haar transform.

13. The method according to claim 1, further comprising:
- creating the fixed-function hardware logic from the generated design.

14. A hardware logic arrangement configured to implement a function in fixed-function hardware, the hardware logic comprising:
- an input for receiving an input value for input to the function;
- a plurality of hardware logic blocks, each hardware logic block implementing one of a plurality of look-up tables, LUTs, in fixed-function hardware and at least two of the plurality of LUTs being derived from a LUT representing the function by applying a transform; and
- a logic unit arranged to perform an inverse transform to generate an output value by selectively combining one or more values output from the plurality of hardware logic blocks dependent on the input value.

15. The hardware logic arrangement according to claim 14, wherein the logic unit is further arranged, as part of performing the inverse transform to:
- add a fixed or linear term to the selective combination of one or more values output from the plurality of hardware logic blocks dependent on the input value.

16. The hardware logic arrangement according to claim 14, wherein the at least two of the plurality of LUTs derived from a LUT representing the function are derived from a LUT that represents a prediction function that approximates the function.

17. The hardware logic arrangement according to claim 16, wherein the plurality of LUTs further comprise a difference LUT, the difference LUT storing differences between the function and the prediction function.

18. The hardware logic arrangement according to claim 16, wherein the plurality of LUTs further comprise two or more LUTs derived from a difference LUT, the difference LUT storing differences between the function and the prediction function.

19. The hardware logic arrangement according to claim 16, wherein the logic unit comprises:
- a first logic unit arranged to selectively combine one or more values output from the plurality of hardware logic blocks dependent on the input value;
- a second logic unit arranged to selectively combine one or more different values output from the plurality of hardware logic blocks dependent on the input value; and
- a third logic unit arranged to perform an inverse transform based on values output from the first and second logic units and the input value.

20. A non-transitory computer readable storage medium having stored thereon computer readable code that when executed at a computer system, causes the computer system to perform a method of implementing a function in fixed-function hardware, the method comprising:
- generating a look-up table, LUT, representing the function;
- applying a transform to the LUT to transform the LUT into a plurality of derived LUTs; and generating a hardware design implementing each of the derived LUTs in fixed-function hardware logic and further implementing an inverse transform to generate an output value by selectively combining one or more values output from the fixed-function hardware logic dependent on the input value.

* * * * *